(12) United States Patent
Kaiser et al.

(10) Patent No.: US 7,047,454 B2
(45) Date of Patent: May 16, 2006

(54) INTEGRATED CIRCUIT HAVING A DATA PROCESSING UNIT AND A BUFFER MEMORY

(75) Inventors: Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 514 days.

(21) Appl. No.: 10/034,070

(22) Filed: Dec. 20, 2001

(65) Prior Publication Data

US 2002/0083380 A1 Jun. 27, 2002

(30) Foreign Application Priority Data

Dec. 20, 2000 (DE) .............................. 100 63 627

(51) Int. Cl.
*G11C 29/00* (2006.01)
(52) U.S. Cl. .................... 714/710; 714/718; 714/7; 365/200
(58) Field of Classification Search ............ 714/7, 714/710; 365/200, 201, 185.05
See application file for complete search history.

(56) References Cited

U.S. PATENT DOCUMENTS

| 5,313,424 | A | | 5/1994 | Adams et al. | |
|---|---|---|---|---|---|
| 5,337,318 | A | * | 8/1994 | Tsukakoshi et al. | 714/708 |
| 5,917,764 | A | * | 6/1999 | Ohsawa et al. | 365/200 |
| 6,085,334 | A | * | 7/2000 | Giles et al. | 714/7 |
| 6,363,008 | B1 | * | 3/2002 | Wong | 365/185.03 |
| 6,415,403 | B1 | * | 7/2002 | Huang et al. | 714/726 |
| 6,445,627 | B1 | * | 9/2002 | Nakahara et al. | 365/200 |
| 6,711,708 | B1 | * | 3/2004 | Shimomura | 714/727 |
| 2001/0030896 | A1 | * | 10/2001 | Ooishi | 365/200 |

FOREIGN PATENT DOCUMENTS

DE 197 08 965 A1 9/1998

OTHER PUBLICATIONS

Dreibelbis et al., "Processor-Based Built-In Self-Test for Embedded DRAM", IEEE Journal of Solid State Circuits, vol. 33 No. 11, Nov., 1998, pp1731-1740.*
Tarr M. et al.: "Defect Analysis System Speeds Test and Repair of Redundant Memories", Electronics, Jan. 12, 1984, pp. 175, 177, 179.

* cited by examiner

*Primary Examiner*—Albert Decady
*Assistant Examiner*—John P. Trimmings
(74) *Attorney, Agent, or Firm*—Laurence A. Greenberg; Werner H. Stemer; Ralph E. Locher

(57) ABSTRACT

An integrated circuit includes a data processing unit, a buffer memory, and a setting memory. The buffer memory performs the function of registers for storing data for the processing unit. The buffer memory is connected to the setting memory. The setting memory can be written to through the buffer memory.

16 Claims, 1 Drawing Sheet

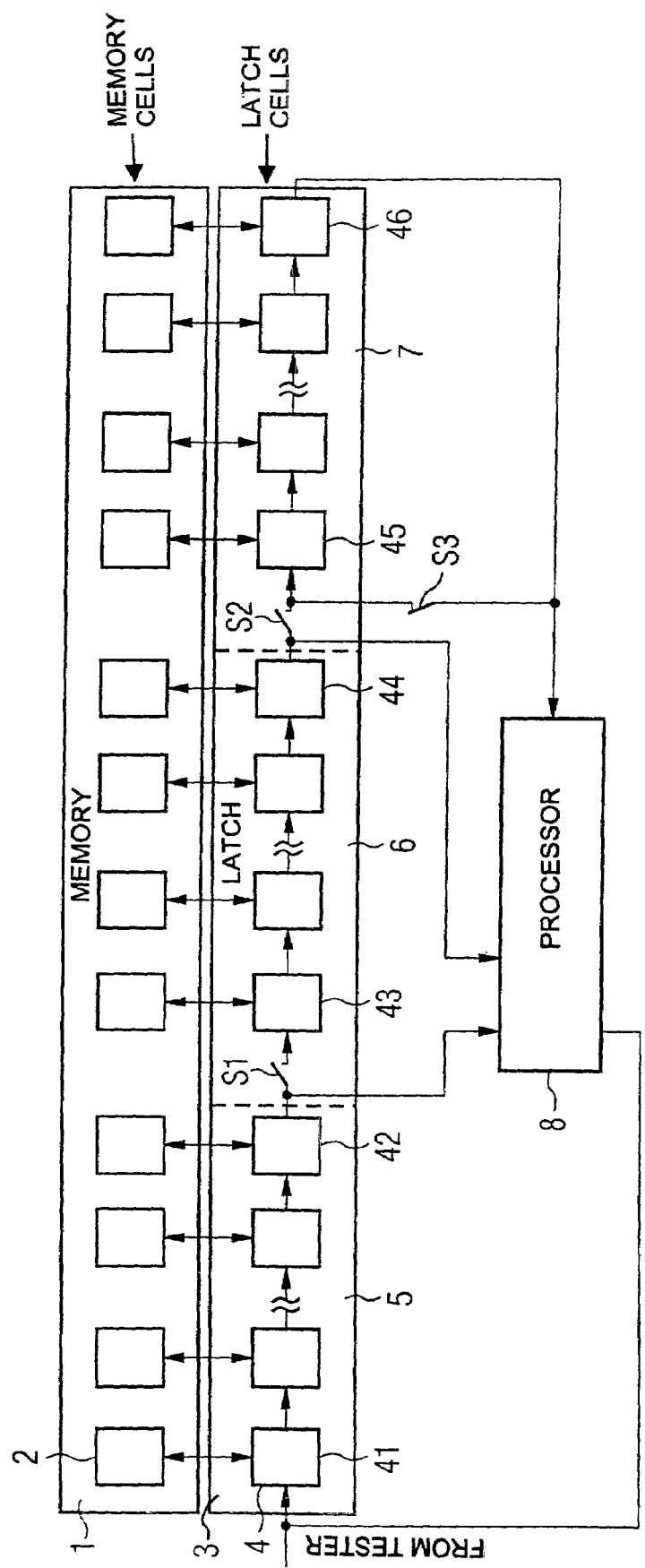

INTEGRATED CIRCUIT HAVING A DATA PROCESSING UNIT AND A BUFFER MEMORY

BACKGROUND OF THE INVENTION

Field of the Invention

The invention lies in the field of integrated circuits. The invention relates to an integrated circuit having a data processing unit and a buffer memory.

An integrated circuit is conventionally tested by having the integrated circuit be supplied with test data from a tester. The output values obtained depending on the applied test data are transferred back to the tester and checked there. If the tester ascertains that a value transferred back does not correspond to a desired value, a defect is identified.

To repair defects in integrated circuits, provision is often made of setting memories that are written to after the conclusion of a test, e.g., to disconnect defective circuit areas and replace them by redundant circuit elements that are additionally provided on the integrated circuit. Such disconnect is performed by using so-called fuses, which represent switches that are initially closed or open and are then opened or closed, respectively, depending on the setting to be performed, with the aid of a suitable programming circuit.

The calculation of the required settings is conventionally carried out in an external tester. The procedure is very time-intensive, in particular, due to the data transfer from and to the tester. If it is desired to determine the settings that are to be performed in the tested integrated circuit, then it is necessary to provide an integrated processing circuit including register memories in which the settings are calculated. In the case of memory modules, such a processing circuit would have to optimize the settings that are to be performed by a redundancy calculation, the settings then activating replacement elements for defect addresses in a memory array. The redundancy calculation in the processing unit is usually carried out by an iterative method. Determining corresponding settings in the circuit to be tested has the disadvantage that a considerable additional outlay on circuitry would be necessary for the processing circuit that carries out the redundancy calculation.

SUMMARY OF THE INVENTION

It is accordingly an object of the invention to provide an integrated circuit having a data processing unit and a buffer memory that overcomes the hereinafore-mentioned disadvantages of the heretofore-known devices and methods of this general type and that makes possible the determination of the individual settings for the setting memory and minimizes the required outlay on circuitry.

With the foregoing and other objects in view, there is provided, in accordance with the invention, an integrated circuit, including a data processing unit, a buffer memory having registers for storing data for the data processing unit, and a setting memory connected to the buffer memory. The buffer memory is connected to the data processing unit. The setting memory can be written to and/or read from through the buffer memory.

The invention has the advantage that it is possible to perform a redundancy calculation for determining the setting values for the setting memory in the integrated circuit that is tested. The requisite circuit, which has a data processing unit, a buffer memory, and a setting memory, in order to carry out the required calculations, would have a non-negligible area requirement in the integrated circuit due to the outlay on circuitry for the register memory. The additional area requirement can be minimized by virtue of the fact that the invention provides for the buffer memory already available in the integrated circuit for writing to the setting memories also to be used as a register for a data processing unit. All that is necessary is an additional outlay on circuitry for the processing unit, but not for the register memories.

In accordance with another feature of the invention, the integrated circuit has circuit elements for replacing defective circuit areas. The circuit elements can be activated by the setting memory. Preferably, the circuit elements are memory elements that replace defective memory areas of a memory. In such a case, it is particularly advantageous to perform the determination of the settings in the integrated circuit to be tested, because, in particular, the optimal utilization of the available circuit elements that are intended to replace the defective memory areas can be calculated only with some computation complexity. The requisite settings are usually determined iteratively, i.e., in a computationally intensive approximation method. With the apparatus according to the invention, it is possible to carry out the requisite computation operations in parallel in the respective integrated circuit, thereby making it possible to save computation capacity in a tester.

In accordance with a further feature of the invention, the processing unit has an arithmetic logic unit (ALU). Such an arithmetic logic unit is usually constructed so that coded instructions in a program memory are applied to the contents of one or more registers. Furthermore, the buffer memory of the integrated circuit is subdivided into a plurality of registers, at least one register being provided for the data to be processed and a further register being provided for coded instructions for the ALU. In such a case, the integrated circuit preferably has two data registers for the data to be processed. Such a configuration is advantageous so that a program register for the coded instructions and two data registers are provided, with whose contents arithmetic or logical operations can be executed in accordance with the instructions. The result is written back to one of the data registers. Because the data can be written to the register cells through the arithmetic logic unit, it is possible for the ALU to write the determined settings directly to the relevant position of the buffer memory for the setting memory. Thus, a considerable amount of time can be saved because the transfer of determined data from the integrated circuit to the tester and/or vice versa is obviated.

In accordance with an added feature of the invention, the buffer memory is two buffer memories each containing data to be processed.

In accordance with an additional feature of the invention, the buffer memory is a latch.

In accordance with yet another feature of the invention, the buffer memory has a shift register.

In accordance with yet a further feature of the invention, the shift register has at least one switch subdividing the shift register into registers for the processing unit.

In accordance with yet an added feature of the invention, the processing unit serially writes to and reads from each of the registers.

In accordance with a concomitant feature of the invention, the setting memory has electrical fuses.

With the objects of the invention in view, there is also provided a method for determining setting data for a setting memory from address data, stored in a register, of memory areas of a memory that have been identified as defective depending on instruction data stored in a register, including the steps of providing an integrated circuit having a data processing unit, a buffer memory having register, and a setting memory, storing data for the data processing unit in registers of the buffer memory, connecting the buffer memory to the data processing unit, connecting the setting memory to the buffer memory, and writing to and/or reading from the setting memory through the buffer memory.

Other features that are considered as characteristic for the invention are set forth in the appended claims.

Although the invention is illustrated and described herein as embodied in an integrated circuit having a data processing unit and a buffer memory, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWING

The FIGURE is a block circuit diagram of an integrated circuit according to the invention.

DESCRIPTION OF THE PREFERRED EMBODIMENTS

Referring now to the FIGURE of the drawings in detail there is shown block circuit diagram of an integrated circuit in accordance with a preferred embodiment of the invention. A setting memory 1 with setting memory cells 2 is situated in a non-illustrated integrated circuit. The setting memory 1 serves for activating redundant circuit areas, in particular, redundant memory areas, in order, thereby, to replace defective areas of a non-illustrated memory array. The setting memory 1 is connected to a latch 3 with latch cells 4 so that each setting memory cell 2 is associated with a latch cell 4. The latch 3 is subdivided into a first latch area 5, a second latch area 6, and a third latch area 7. The latch cells 4 in each of the latch areas 5, 6, 7 are connected up as shift registers, i.e., the output of one latch cell is connected to the input of a next latch cell 4. The first latch area 5 and the second latch area 6 preferably have the same number of latch cells 4 in each case. However, it may also be provided that the number of latch cells 4 in the first latch area 5 differs from that in the second latch area 6.

The respective first and last latch cells of the latch cells 4 of the three latch areas 5, 6, 7 are provided with the reference symbols 41, 43, 45 and 42, 44, 46, respectively. The output of the last latch cell 42 of the first latch area 5 is switchably connected through a switch S1 to the input of the first latch cell 43 of the second latch area 6, so that a shift register including the first and second latch areas is formed when the switch is closed. Equally, the output of the last latch cell 44 of the second latch area 6 is switchably connected through a switch S2 to an input of the first latch cell 45 of the third latch area 7, so that a shift register is formed by the second latch area 6 and the third latch area 7 when the switch S2 is closed. If both switches S1 and S2 are closed, all the latch cells 4 together form a shift register.

The outputs of the last latch cells 42, 44 of the first latch area 5 and of the second latch area 6 are connected respectively to a processing unit 8, so that the data in the latch areas 5, 6, 7 can be read serially. An output of the processing unit 8 is connected to an input of the first latch cell 41 of the first area 5. The output of the last latch cell 46 of the third latch area 7 is connected, on one hand, to an input of the processing unit 8 and is switchably connected, on the other hand, through a switch S3 to the input of the first latch cell 45 of the third latch area 7. The switches S1, S2, and S3 are controlled through the processing unit 8. Furthermore, a non-illustrated external tester is connected to the input of the first latch cell 41 of the first area 5, through which tester the latch cells can be written to or read from.

To generate setting data for the setting memory 1 from defect data, i.e., defective output data given the presence of a specific test pattern, such as, e.g., addresses of defective memory cells, the defect data must usually be processed in an algorithm. The result of the algorithm then constitutes setting data that are stored in the setting memory 1. In conventional test systems, the calculation is carried out in a non-illustrated external tester, i.e., the defect data are transferred to the external tester, where the calculation is carried out, and then the setting data are transferred back into the integrated circuit for storage in the setting memory 1.

In the exemplary embodiment according to the invention, the integrated circuit is provided in a memory module. After being written to, the setting memory 1 then receives setting values, whereby redundancy memory areas are enabled that replace defective memory cells in a main cell array. Because both word and bit lines and individual cells can be replaced by the setting memory, it is expedient to combine, in an algorithm, defective cells, if possible, to form word or bit lines that are then replaced by a redundant word or bit line provided therefor.

The integrated circuit according to the invention makes it possible to carry out the calculation in the memory module. As a result of using the latch cells 4 for the setting memory cells 2 as registers for the processing unit 8, a considerable amount of area can be saved on the memory module.

A redundancy calculation is carried out as set forth below.

First, the determined defect data and the processing instructions are made available by the non-illustrated tester and are then written serially to the latch 3, constructed as a shift register, so that the first latch area 5 and the second latch area 6 contain defect data and the third latch area 7 contains instruction data. To write such data to the latch 3, the switches S1 and S2 must be closed, so that the entire latch 3 forms a uniform shift register. However, data that are generated in the integrated circuit or are stored there can also be written to the latch 3. Thus, by way of example, data from a desired/actual comparison that takes place in the integrated circuit can be written to the latch areas 5, 6 and program data from a ROM memory can be written to the latch area 7.

If the latch 3 contains the data provided, the processing unit 8 begins to execute the instruction in the third latch area 7. To that end, the switches S1 and S2 are opened and switch S3, depending on whether or not cyclic processing is necessary, is closed. The content of the last latch cell 46 of the third area 7 is then read out by being shifted toward the right into the processing unit 8. In such a case, the content of the last latch cell 46 is written to the first latch cell 45 of the third latch area 7 again if the switch S3 is closed.

In accordance with the received instruction, the processing unit 8 reads in the content of the last latch cell 42 of the first latch area 5 and/or the content of the last latch cell 44 of the second latch area 6 and combines these contents in accordance with the received instructions. The result is written to the first latch cell 41 of the first latch area 5, and all of the positions of the latch cells 4 are shifted toward the right, the content of the last latch cell 42 of the first latch area being read into the processing unit 8.

The processing cycle is repeated a predetermined number of times and, in the process, successively through a shifting-toward-the-right of the latch cells of the first area 5 and/or of the latch cells 4 of the second latch area 6, all the latch cells of the first latch area 5 and of the second latch area 6 are processed in accordance with the received instruction in the processing unit 8. With the read-out of the contents of the latch cells 4 of the first latch area 5, the respective result of the processing is simultaneously written to the first latch area 5 at the input of the first latch cell 41 of the first latch area 5.

After the specific number of cycles has taken place, the instruction has been processed and the next instruction is read from the last latch cell 46 of the third latch area 7 into the processing unit 8 by a shifting-toward-the-right process. In the processing unit 8, as described above, the content of the latch cells 4 of the first latch area 5 and/or the content of the latch cells of the second latch area 6 are/is processed in accordance with the instruction and the result is written in each case to the first latch cell 41 of the first latch area 5. The processes of read-out and writing to the latch area 5 and the second latch area 6 are effected by the contents being shifted toward the right.

The processing unit 8 can likewise provide, through control of the switch S1, for the contents of the first latch area 5 to be transferred into the second latch area 6 by a shifting-toward-the-right process. Analogously, it is also possible to transfer contents of the second latch area 6 through the processing unit 8—controlled by instructions stored in the third latch area 7—into the first latch area 5. Furthermore, it is possible, by the closing of the switch S2 and opening of the switch S3, to transfer the content of the second latch area 6 into the third latch area 7. As such, it is also possible to load a result of a previously effected operation into the third latch area 7, the instruction memory, which means that it is possible to carry out complex program sequences that depend on the result of previous operations.

Furthermore, it is possible for the integrated circuit according to the invention to use only some of the available latch cells 4 as register cells. By way of example, the output of the last latch cell 46 of the third area 7 could be connected through a further non-illustrated switch to further latch cells 4 associated with respective setting memory cells 2. As a result, it would be possible to store setting values already determined for the setting memory 1 in the relevant latch cells 4 without these values having to be transferred beforehand to the external tester for buffer-storage or the like.

It goes without saying that the latch cells 4 can also be subdivided into more than three areas. This means that it is possible to perform even more complex operations with more than two registers in the processing unit 8.

The closing of the switch S3 effects feedback of the program memory in the third latch area 7, so that a predetermined sequence of instructions can be executed repeatedly. Such a process is preferably suitable for carrying out iterative calculation methods that have to be performed, in particular in the optimization of setting values from defect data. The optimization enables a considerable amount of computation time to be saved, because, during a test run, the integrated modules can carry out in parallel computation operations that would have taken place in the tester according to a conventional method.

The size of the latch areas 5, 6, 7 can be chosen arbitrarily. It is expedient, however, to provide the first and second latch areas 5, 6 in the size of a memory address to be able to process addresses of defective memory cells and to provide the third latch area 7 in a size sufficient for the operations for the processing unit 8.

The features of the invention that are disclosed in the above description, the drawing and the claims may be of importance both individually and in any desired combination for the realization of the invention in its various configurations.

We claim:

1. An integrated circuit, comprising:
   a data processing unit;
   a buffer memory having registers for storing data for said data processing unit, said buffer memory connected to said data processing unit; and
   a setting memory connected to said buffer memory, said setting memory having at least one electrical fuse being at least one of written to and read from through said buffer memory;
   said buffer memory having a shift register, said shift register having at least one switch subdividing said shift register into said registers for said data processing unit.

2. The integrated circuit according to claim 1, including circuit elements, said setting memory activating said circuit elements.

3. The integrated circuit according to claim 2, including a memory having memory areas, said circuit elements being memory elements used to replace at least one of said memory areas.

4. The integrated circuit according to claim 1, wherein said data processing unit has an arithmetic logic unit.

5. The integrated circuit according to claim 4, wherein
   a register of said registers processes data; and
   another register of said registers processes coded instructions for said arithmetic logic unit.

6. The integrated circuit according to claim 5, wherein said buffer memory is two buffer memories each containing data to be processed.

7. The integrated circuit according to claim 1, wherein said buffer memory is a latch.

8. The integrated circuit according to claim 1, wherein said data processing unit serially writes to and reads from each of said registers.

9. A method for determining setting data for a setting memory from address data, stored in a register, of memory areas of a memory that have been identified as defective depending on instruction data stored in a register, which comprises:
   providing an integrated circuit having:
      a data processing unit;
      a buffer memory having registers, the buffer memory having a shift register, the shift register having at least one switch subdividing the shift register into the registers; and
      a setting memory having electrical fuses;
   storing data for the data processing unit in the registers of the buffer memory;
   connecting the buffer memory to the data processing unit;
   connecting the setting memory to the buffer memory, the setting memory being only accessible via the registers of the buffer memory, the buffer memory being used as latches for reading out and writing into the setting memory; and
   at least one of writing to and reading from the setting memory through the buffer memory.

10. The method according to claim 9, which further comprises activating circuit elements with the setting memory.

11. The method according to claim 10, wherein the circuit elements are memory elements of a memory and which further comprises replacing at least one of the memory areas with the memory elements.

12. The method according to claim 9, wherein the data processing unit has an arithmetic logic unit.

13. The method according to claim 12, which further comprises:

processing data with a register, and processing coded instructions for the arithmetic logic unit with another register.

14. The method according to claim 13, wherein the buffer memory is two buffer memories each containing data to be processed.

15. The method according to claim 9, wherein the buffer memory is a latch.

16. The method according to claim 9, which further comprises serially writing to and reading from each of the registers with the processing unit.

* * * * *